United States Patent
Ogawa et al.

(10) Patent No.: US 6,472,297 B1
(45) Date of Patent: Oct. 29, 2002

(54) METHOD OF PRODUCING TFT ARRAY SUBSTRATE FOR LIQUID CRYSTAL DISPLAY DEVICE

(75) Inventors: Kazufumi Ogawa, Nara (JP); Kazuyasu Adachi, Kobe (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/647,397

(22) PCT Filed: Mar. 30, 1999

(86) PCT No.: PCT/JP99/01646

§ 371 (c)(1),
(2), (4) Date: Sep. 29, 2000

(87) PCT Pub. No.: WO99/52013

PCT Pub. Date: Oct. 14, 1999

(30) Foreign Application Priority Data

Mar. 31, 1998 (JP) ........................... 10-085699
Mar. 31, 1998 (JP) ........................... 10-085726

(51) Int. Cl.[7] ............................................. H01L 21/20
(52) U.S. Cl. ...................... 438/488; 438/149; 438/163; 438/30; 438/485
(58) Field of Search ....................... 438/197, 149, 438/154, 155, 30, 488, 491, 485, 164

(56) References Cited

U.S. PATENT DOCUMENTS 5,618,758 A * 4/1997 Tomita et al. .............. 438/485
5,798,744 A * 8/1998 Tanaka et al. ................ 345/92
5,940,690 A * 8/1999 Kusumoto et al. .......... 438/149
5,950,078 A * 9/1999 Maekawa et al. ........... 438/149
5,980,999 A * 11/1999 Goto et al. .................. 427/572

FOREIGN PATENT DOCUMENTS

| JP | 7-93440 | 2/1981 |
|---|---|---|
| JP | 58-4180 | 6/1981 |
| JP | 60-208823 | 4/1984 |
| JP | 63-219123 | 3/1987 |
| JP | 4-318973 | 4/1991 |
| JP | 6-175103 | 12/1992 |
| JP | 7-335900 | 6/1994 |
| JP | 9-105908 | 10/1995 |
| JP | 9-237762 | 12/1996 |

* cited by examiner

Primary Examiner—Michael Trinh
(74) Attorney, Agent, or Firm—Parkhurst & Wendel, L.L.P.

(57) ABSTRACT

There is suggested a method for forming a good-quality polysilicon layer having a large area through a low temperature process even if laser annealing is not conducted. An object of the present invention is therefore to provide a poly-Si TFT array substrate exhibiting little display unevenness and having a high exactitude even if it has a large screen. This object can be attained by a method for producing a TFT array substrate for a liquid crystal display device, comprising a process of forming, on a substrate, a poly-Si TFT in which a polysilicon semiconductor layer is used in a channel area, comprising a polysilicon layer forming step of depositing silicon particles excited by adding energy beforehand onto the substrate so that the polysilicon layer is formed at the stage when the silicon particles are deposited on the substrate.

31 Claims, 7 Drawing Sheets

(a)

(b)

METHOD OF PRODUCING TFT ARRAY SUBSTRATE FOR LIQUID CRYSTAL DISPLAY DEVICE

TECHNICAL FIELD

This invention relates to a TFT array substrate for a liquid crystal display device in an active matrix mode, using a thin film transistor.

BACKGROUND ART

In recent years, there have been actively developed liquid crystal display devices in an active matrix mode in which a polysilicon thin film transistor (referred to as a poly-Si TFT hereinafter) of a low temperature processed type is used as a control element instead of an amorphous silicon thin film transistor. The reasons thereof are as follows: the exactitude of liquid crystal display devices can be made higher and their numerical aperture can be made higher because the poly-Si TFT has a larger electric field-effect mobility than the amorphous silicon TFT; and it may be possible to provide liquid crystal display devices having a large area and a high exactitude at low cost since the low temperature processed type makes it possible to use an inexpensive glass substrate.

Referring to FIG. 7, a method for producing such a low temperature processed poly-Si TFT will be described. In FIG. 7, 701, 702, 703, 704 and 705 represent a glass substrate, a buffer layer, an amorphous silicon layer, a polysilicon layer and a gate insulator layer, respectively. 706, 707, 708, 709, 710 and 711 represent a gate electrode, a source area, a drain area, contact holes, a source electrode and a drain electrode, respectively.

In the process for production thereof, the buffer layer 702 made of a $Si_3N_4$, for example, 600 Å in thickness is first formed on the glass substrate 701. Amorphous silicon is deposited on the entire surface of this buffer layer 702 (FIG. 7(a)). Next, the entire surface of this amorphous silicon layer 703 is irradiated with an excimer laser to heat and melt the silicon and re-crystallize it. In this way, the polysilicon layer 704 is made. A $Si_3N_4$ layer, for example, 200 Å in thickness and a $SiO_2$ layer 1500 Å in thickness are vapor-deposited on the polysilicon layer 704 to form the gate insulator layer 705. The gate electrode 706 made of Mo, for example, 6000 Å in thickness is formed on the gate insulator layer 705. Phosphorus ion is implanted into the polysilicon layer 704 through the gate electrode 706 as a mask (FIG. 7(b)). Irradiation with an excimer laser is again conducted to activate the phosphorus ion implanted into the polysilicon layer 704. In this way, the source area 707 and the drain area 708 are made (FIG. 7(c)). At last, the gate insulator layer 705 is etched to make the contact holes 709/709 reaching the source area 707 and the drain area 708. In this way, the source electrode 710 and the drain electrode 711 each having a thickness of 3000 Å, in which Al is embedded in the contact holes 709/709, are formed. By the above-mentioned process, a low temperature processed poly-Si TFT is completed.

In this method, a rise in the temperature of the substrate is a little (about 600° C. or lower) since the excimer laser is used for polycrystallization. Therefore, an inexpensive substrate can be used, and a polysilicon thin film having a larger area can be formed, as compared with high temperature processing method (about 1000° C.). Thus, the screen of liquid crystal display devices can be made large.

However, if the above-mentioned low temperature processing method is used to produce a liquid crystal display device having a large screen, display unevenness becomes large. At present, sufficient display performance cannot be realized.

DISCLOSURE OF THE INVENTION

A main object of the present invention is to overcome the above-mentioned problems in a low temperature processed poly-Si TFT in the prior art. More specifically, it is an object to provide a poly-Si TFT array substrate having a high electric field-effect mobility and a little in-plane dispersion without using an expensive quartz substrate. It is another object to use such a poly-Si TFT array substrate so as to provide a more inexpensive liquid crystal device having a large screen, a high exactitude and a high performance.

Before disclosure of the constitution of the present invention for attaining the above-mentioned objects, the cause of generation of display unevenness in low temperature processed poly-Si TFTs in the prior art will be discussed.

FIG. 4 is a schematic plan view of a TFT array substrate. In FIG. 4, 412 and 413 represent a glass substrate, and a pixel area formed on the glass substrate 412, respectively. In this pixel area 413, non-illustrated pixels are arranged in a matrix form and non-illustrated pixel switching TFTs are arranged so as to correspond to the respective pixels. 414 and 415 represent so-called peripheral driving circuits for driving the pixel-switching TFTs. For example, 414 represents a gate driving circuit unit and 415 represents a source driving circuit unit having therein the TFTs.

As shown in FIG. 7, in conventional methods, amorphous silicon is deposited on the entire surface of the glass substrate 412. Thereafter, the substantially entire surface of the amorphous silicon layer is irradiated with an excimer laser to melt and polycrystallize the silicon. According to this method, however, the following problems arise.

That is, since the width of an excimer laser is limited, a large area is not irradiated with the laser at once. Thus, a method in which a linear excimer laser (line beam) is successively scanned on a substrate is adopted. However, according to this method, long and narrow crystal grains are produced along the line direction of the line beam. Furthermore, the shapes and the sizes of the crystal grains easily become nonuniform since this method is a method in which the crystallization is successively attained. The amorphous silicon layer has no crystal nuclei for inducing crystal growth at the initial stage of crystallization. Thus, at some stage that the excimer laser is applied and the crystallization starts, crystal nuclei are generated uncertainly and disorderedly so that crystal grows rapidly. Therefore, the crystal growth becomes unstable and disordered so that the shapes and the sizes of the crystal grains become nonuniform. Moreover, grain boundaries where very small crystal grains collide with each other swell and the structure of the grain boundary portions are distorted since the crystal grows rapidly.

In reality, the inventors scanned an excimer laser (line beam) on a 320 mm×400 mm amorphous silicon layer to carry out polycrystallization, and then examined the electric field-effect mobility of respective sites of this polysilicon layer. As a result, it was verified that the electric field-effect mobility varied within the range of 50 to 300 $cm^2$/V-s, dependently on the sites. The following tendency was also verified: polysilicon at the peripheral area had a higher electric field-effect mobility than polysilicon at the center.

In other words, according to the method for producing a low temperature processed poly-Si TFT which has been hitherto known, the electric field-effect mobility of its polysilicon layer becomes nonuniform. This tendency becomes remarkable, particularly in TFTs formed in an array form in a pixel area. This would cause display unevenness (for example, linear unevenness). On the other hand, according to a high temperature processing polycrystallization method (about 1000° C. or higher), which is performed using an expensive quartz substrate, the above-mentioned problems of the low temperature process method are easily solved. However, according to the high temperature processing method, it is difficult that a large screen is produced. Moreover, a problem that costs increase arises.

The present invention for solving problems as describe above has the following constitutions. The present invention is classified to from a first invention group to a seventh invention group, and these groups will be successively described.

(1) First Invention Group

A first embodiment of the present invention concerned in the first invention group is a method for producing a TFT array substrate for a liquid crystal display device, comprising a process of forming, on a substrate, a poly-Si TFT in which a polysilicon semiconductor layer is used in a channel area, characterized by comprising a polysilicon layer forming step of depositing silicon particles excited by adding energy beforehand onto the substrate so that the polysilicon layer is formed at the stage when the silicon particles are deposited on the substrate.

According to this constitution, it is possible to form a polysilicon layer having a uniform electric field-effect mobility in its plane even if the layer has a large area. The reason thereof is as follows.

The method for forming polysilicon layer in the prior art is a method of depositing amorphous silicon on a substrate and then heating and melting the amorphous silicon to recrystallize the silicon. In this way, a polysilicon layer is formed. However, according to this method, crystal nuclei are generated uncertainly and disorderedly at an initial stage after the heating and melting, so that the shapes and the sizes of the crystal grains become nonuniform. Thus, such a problem that electric field-effect mobility varies widely arises.

On the contrary, the above-mentioned constitution is a production method wherein by using silicon particles to which energy is added, the silicon particles turn to a polysilicon layer at the stage when the silicon particles are deposited on a substrate. Since this method does not comprise the step of heating and melting amorphous silicon to recrystallize the silicon, such a problem caused in the conventional low temperature processing method does not arise. This fact will be further described. According to the above-mentioned constitution, the silicon particles to which the energy is added have an energy over a regular level for some time after the particles reach the substrate. Therefore, the particles migrate on the substrate so that they move to a stable point where their energy state is more stabilized. By such movement, polycrystallization of the deposited layer advances. However, during the advance of the polycrystallization, new silicon particles are successively deposited so that the particles migrate on the substrate. Accordingly, even if defects or the like are generated in crystal structure, the crystal defects or the like are cured with the newly added silicon particles. Thus, according to the above-mentioned constitution, it is possible to form crystal grains having a small amount of the crystal defects and form a polysilicon layer having a uniform density and a good quality.

According to the low temperature processing method in the prior art, temperature distribution becomes nonuniform if the area of a substrate becomes large. For this reason, it is difficult to form a polysilicon layer having a good quality. The production method of the present invention is, however, a method of attaining polycrystallization at the same time when silicon particles to which energy is added are successively deposited on a substrate. Accordingly, a polysilicon layer having a uniform quality can be formed without being affected by the size of the area of the substrate. Moreover, productivity is good since heating and melting are unnecessary.

A second embodiment concerned in the first invention group is characterized in that after the polysilicon layer forming step in the first embodiment, a heating-treatment step for heating and melting the polysilicon layer formed in the polysilicon layer forming step to recrystallize the polysilicon is further added.

According to this constitution that the polysilicon layer formed in the polysilicon layer forming step is subjected to the heating-treatment, the polysilicon layer can be made to have a very high electric field-effect mobility. The reason thereof is as follows. When the polysilicon layer is heated, small crystal grains are melted to become a melted product to be recrystallized. However, large crystal grains are not melted completely to remain as fine grains. They turn to crystal nuclei for recrystallization. Thus, the recrystallization advances smoothly. As a result thereof, it is possible to form a recrystallized polysilicon layer which is a product in which crystal grains made of uniform and large grains gather. Since such a polysilicon layer has a high electric field-effect mobility, a poly-Si TFT having high rapidity can be produced.

A third embodiment concerned in the first invention group is characterized in that the heating-treatment in the heating-treatment step is conducted in an atmosphere comprising hydrogen.

When the heating-treatment is conducted in the hydrogen atmosphere, dangling bonds of silicon are terminated. Therefore, the electric field-effect mobility of the polysilicon layer can be further improved.

A fourth embodiment concerned in the first invention group is characterized by comprising, after the polysilicon layer forming step, the steps of producing a pixel-switching poly-Si TFT and producing a driving poly-Si TFT for driving the pixel-switching poly-Si TFT.

Since the polysilicon layer formed in the polysilicon layer forming step has a high electric field-effect mobility, the TFT having this polysilicon layer as a channel area has a superior rapidity. The TFT can be appropriately used as not only a pixel-switching element but also an element for a driving circuit of the pixel-switch. Thus, according to the above-mentioned production method for producing both of a pixel-switching poly-Si TFT and producing a poly-Si TFT for driving this on a single substrate, a TFT array substrate for a liquid crystal display device having a superior rapidity and a superior integration degree can be efficiently produced.

A fifth embodiment concerned in the first invention group is characterized in that the fourth embodiment comprises a specific area heat-treating step of selectively heat-treating only a specific area where the poly-Si TFT for driving should be formed before the step of forming the poly-Si TFT for driving, to increase crystallinity of the polysilicon layer in this area.

According to this constitution, only the specific area where the poly-Si TFT for driving should be formed is beforehand heat-treated to conduct recrystallization. In this method, a TFT array substrate having superior rapidity can be efficiently produced. This is because the driving TFT needs higher rapidity than any pixel-switching TFT. On the other hand, the specific area where the TFT for the peripheral driving circuit should be formed has a smaller area than the whole area of the substrate. Therefore, if the above-mentioned constitution that only the circuit portion which needs higher rapidity is heated-treated, recrystallization can be attained at a smaller energy. Nonuniformity is not easily caused in temperature distribution by the small of the heated area. Therefore, uniform crystallization can be attained.

A sixth embodiment concerned in the first invention group is characterized in that in the fifth embodiment, an excimer laser or an infrared ray lamp is used as a heating means in the specific area heat-treating step. The excimer laser or the infrared ray lamp is preferable since it makes partial heating possible and has good heating efficiency.

Referring to the above-mentioned FIG. 4, the fifth embodiment and the sixth embodiment will be further described.

FIGS. 4(a) and 4(b) are plan views showing an outline of an ordinary TFT array substrate for a liquid crystal display device. The difference between FIG. 4(a) and FIG. 4(b) is that the areas of the display portions of the liquid crystal display devices are different. That is the display area in FIG. 4(b) is larger than that in FIG. 4(a). In the conventional method of forming an amorphous silicon layer on a substrate and subsequently subjecting the resultant to excimer laser annealing to attain crystallization, an excimer laser beam must be applied onto the substantial entire surface of the substrate. At present, however, there are not devices in which an excimer laser beam can be applied at a time onto a large area. Thus, a method of scanning a linear excimer laser beam successively is adopted. According to this method, however, productivity is poor and it is difficult to obtain a uniform polysilicon layer. According to the method of additionally using an infrared ray lamp for irradiating the entire surface with infrared rays, the temperature of the substrate rises. Therefore, inexpensive glass substrates cannot be used.

On the other hand, according to the fifth embodiment and the sixth embodiment, such problems as in the prior art cannot arise. First, this is because the layer formed on the substrate is a polysilicon layer from the beginning. Second, this is because only the specific area limited onto the substrate is heat-treated (recrystallized).

As is clear from the comparison between FIGS. 4(a) and 4(b), the width of the driving circuit portions is not very much affected by the size of the display portions. Thus, if only the driving circuit portion is recrystallized, recrystallization can be attained without use of especial excimer laser applying device. Since the other portion (the pixel portion) is made of a polysilicon layer, the it has sufficient electric field-effect mobility even if it is not recrystallized. Furthermore, recrystallization of a polysilicon layer makes it possible to gain a higher quality than crystallization of an amorphous layer. For these reasons, according to the fifth embodiment and the sixth embodiment, uniform transistor characteristics can be obtained on the entire surface of the array substrate.

If, in FIG. 4(a), scanning directions 433a and 433b at the time of applying line beams 432a and 432b of an excimer laser while scanning these beams are made parallel to scanning directions of source and gate signals, efficient recrystallization can be performed even when the laser has a short beam width.

A seventh embodiment concerned in the first invention group is characterized in that in the sixth embodiment, the heat-treatment in the specific area heat-treating step is conducted in an atmosphere containing hydrogen. In the case that the heat-treatment is conducted in the atmosphere containing hydrogen, dangling bonds of silicon can be terminated and the electric field-effect mobility of the polysilicon layer can be further improved. Thus, this case is preferable.

An eighth concerned in the first invention group is characterized in that in the fifth embodiment, the heat-treatment is conducted so that the electric field-effect mobility of the specific area will be 100 $cm^2$/V-s or more. When the electric field-effect mobility is made 100 $cm^2$/V-s or more, high-frequency driving can be attained.

A ninth embodiment concerned in the first invention group is characterized in that the second embodiment comprises, after the heat-treating step, the step of producing a pixel-switching poly-Si TFT for switching a pixel, and an IC chip integrating step of integrating a monocrystal silicon IC chip having therein a circuit for driving the pixel-switching poly-Si TFT produced in the above-mentioned production step into the substrate.

A poly-Si TFT makes far faster switching possible than an amorphous Si type TFT. Therefore, if a monocrystal silicon IC chip which can be driven by high frequency is combined, as a driving element, with this pixel-switching poly-Si TFT, it is possible to produce a TFT array substrate for a liquid crystal display device in which high-speed operating performance of the monocrystal silicon IC chip can be sufficiently utilized to exhibit superior response speed.

A tenth embodiment concerned in the first invention group is characterized in that the polysilicon layer forming step in the first embodiment is made to the step of applying thermal energy to an vapor source comprising solid silicon to vaporize silicon to prepare silicon particles; exciting and ionizing the silicon particles in a plasma atmosphere, and then depositing the excited silicon particles onto the substrate.

According to this constitution, the vapor source comprising silicon which is the same material as constitutes the polysilicon layer is used so that the polysilicon is formed. Thus, no impurities are incorporated into the polysilicon layer. According to this method using the vapor source, the area where the silicon particles are generated can be made wide and the silicon particles can be deposited from various directions onto the surface of the substrate. Thus, the formed polysilicon layer can be made superior in uniformity. This advantage can be remarkably exhibited, particularly in the case that a polysilicon layer having a large area is formed.

Furthermore, according to this constitution, the silicon particles are excited and ionized in the plasma atmosphere and then the particles are deposited onto the surface of the substrate to form a deposition layer. The silicon particles deposited in this method keep energy after they reach the substrate so that they can migrate to stable points where the state of energy can be more stabilized on the substrate. Thus, if defects are generated in the crystal during the step of crystallization, newly deposited silicon particles migrate to cancel the defects. According to the production method of this constitution, a polysilicon layer of minute crystal having a few defects is formed by such movement of the silicon particles. Such a polysilicon layer is superior in transistor characteristics.

An eleventh embodiment concerned in the first invention group is characterized in that in the tenth embodiment, the substrate in the polysilicon layer forming step is arranged outside the plasma atmosphere. If the substrate is arranged inside the plasma atmosphere, plasma particles collide with each other so that the temperature of the substrate rises.

However, according to the above-mentioned constitution in which the substrate is arranged outside the plasma atmosphere, such a problem does not arise. Thus, an inexpensive glass substrate low in heat-resistant temperature can be used.

A twelfth embodiment concerned in the first invention group is characterized in that in the eleventh embodiment, the substrate in the polysilicon layer forming step is arranged in a direction different from a direction along which the silicon particles are vaporized from the vapor source.

According to this constitution, the vaporized silicon particles move once so as to be apart from the substrate. Thereafter, only the excited and ionized particles having high energy are applied on the surface of the substrate.

A thirteenth embodiment concerned in the first invention group is characterized in that the polysilicon layer forming step in the first embodiment is a step of exciting and ionizing the silicon particles generated by decomposing a gaseous silicon compound with high frequency energy in the plasma atmosphere, and then depositing the excited silicon particles onto the substrate.

Even in the process of decomposing the gaseous silicon compound to produce the silicon particles, the effect and advantage described in the first embodiment can be obtained. However, in this method in which the silicon compound is decomposed, productivity is poorer and impurities are more easily incorporated into the formed polysilicon layer than in the method in which the silicon particles are generated from the solid siliconvaporation source.

A fourteenth embodiment concerned in the first invention group is characterized in that in the thirteenth embodiment, the substrate in the polysilicon layer forming step is arranged outside the plasma atmosphere. According to this constitution, the same effect and advantage as in the eleventh embodiment can be obtained.

A fifteenth embodiment concerned in the first invention group is characterized in that in the 11th, 12th, 13th or 14th embodiment, a means for applying an electric field is disposed between the plasma atmosphere and the substrate and the silicon particles excited and ionized in the plasma atmosphere are pulled out by the electric field and applied onto the substrate.

According to this constitution, only the ionized particles in the plasma atmosphere are pulled out from the silicon particles excited and ionized in the plasma atmosphere with the electric field applying means and then they are applied onto the substrate. Since the ionized particles have high energy levels, they migrate actively on the substrate to form a better-quality polysilicon layer. Thus, a poly-Si TFT having higher rapidity can be formed.

A sixteenth embodiment concerned in the first invention group is characterized in that in the tenth embodiment, the polysilicon layer forming step is a step of using a pressure gradient type plasma gun comprising a silicon particle generating means for applying arc discharge energy onto the vapor source comprising the solid silicon to vaporize silicon and produce the silicon particles and an exciting means for introducing the produced silicon particles to the plasma atmosphere to excite the particles and produce the ionized particles, so as to produce the excited and ionized silicon particles; and depositing the silicon particles onto the substrate.

If the above-mentioned pressure gradient type plasma gun is used, it is possible to form very efficiently a polysilicon layer having high quality, in particular to form efficiently a polysilicon layer having a large area.

(2) Second Invention Group

A seventeenth embodiment of the present invention, concerned in the second invention group, is a method for producing a TFT array substrate for a liquid crystal display device, having a process for producing a TFT on a substrate, characterized by comprising a gate insulator layer forming step of applying thermal energy to a solid vapor source comprising the same material as constitutes a gate insulator layer to vaporize the material to prepare particles; and exciting and ionizing the particles in a plasma atmosphere to be applied and deposited onto the substrate, so as to form the gate insulator layer on a silicon semiconductor layer of a channel area in the TFT.

The gate insulator layer forming step is an evaporation method having the same principle as the polysilicon layer forming method described in the first invention group. In this evaporation method, the very same material as constitutes the gate insulator layer is used as the vapor source and the particles vaporized from this vapor source are deposited to make the gate insulator layer. Therefore, impurities of the formed gate insulator layer can be made to be very small amount. According to the production method of the above-mentioned constitution, the gate insulator layer can be successively formed on the polysilicon layer without exposing to the atmosphere the silicon layer as an active layer of the TFT by adopting a load lock manner. The interface between the silicon layer and the gate insulator layer can be completely prevented from being polluted.

Furthermore, according to the production method of the above-mentioned constitution, a uniform and minute gate insulator layer can be formed in the same way as in the case of the polysilicon layer. As a result thereof, a TFT array substrate in which transistor characteristics hardly vary can be produced.

(3) Third Invention Group

An eighteenth embodiment concerned in the third invention group is a method for producing a TFT array substrate for a liquid crystal display device, having a process for producing a TFT on a substrate, characterized by comprising a gate insulator layer forming step of decomposing a gaseous compound containing the same atom as constitutes a gate insulator layer with high frequency energy to generate particles containing the same atom, and exciting and ionizing the particles containing the same atom in a plasma atmosphere and depositing the particles onto the substrate to form the gate insulator layer on a silicon semiconductor layer of a channel area in the TFT.

This constitution is a matter in which the same principle as in the thirteenth embodiment of the first invention group is used for the formation of the gate insulator layer. By this constitution, it is possible to form TFTs in which Vt characteristics (operating threshold voltage of transistors; threshold voltage) hardly vary.

(4) Fourth Invention Group

A nineteenth embodiment concerned in the fourth invention group is a method for producing a TFT array substrate for a liquid crystal display device, having a process for producing a poly-Si TFT on a substrate, characterized by comprising the step of applying thermal energy to an vapor source comprising solid silicon to vaporize silicon to prepare silicon particles, and exciting and ionizing the particles in a plasma atmosphere and depositing the particles onto the substrate to form a polysilicon layer on the substrate; and a gate insulator layer forming step of applying thermal energy to a solid vapor source comprising the same material as constitutes a gate insulator layer to vaporize the material to prepare particles, and exciting and ionizing the particles in a plasma atmosphere and depositing the particles onto the substrate to form the gate insulator layer.

According to this constitution, it is possible to produce TFTs having a high electric field-effect mobility and less varied Vt characteristics with high productivity.

A twentieth embodiment concerned in the fourth invention group is characterized in that in the nineteenth embodiment, as a device for performing the polysilicon layer forming step and the gate insulator layer forming step, a pressure gradient type plasma gun is used, the plasma gun comprising a particle generating means for applying arc discharge energy onto an vapor source comprising a solid material to vaporize the vapor source to generate particles and an exciting means for introducing the generated particles into the plasma atmosphere to be excited and ionized.

If the above-mentioned pressure gradient type plasma gun is used, vaporized particles can be efficiently generated. The area where the particles are vaporized can also be made wide. Therefore, it is possible to form uniform thin films whose film densities vary a little. The effect and advantage are remarkably exhibited particularly in the case that the area of the thin films becomes large.

(5) Fifth Invention Group

A twenty first embodiment concerned in the fifth invention is a TFT array substrate for a liquid crystal display device, comprising at least a transparent pixel electrode, a pixel-switching TFT for switching the transparent pixel electrode and a driving element for driving the pixel-switching TFT arranged on a transparent substrate, characterized in that a poly-Si TFT having an electric field-effect mobility of 1–25 $cm^2$/V-s is used as the pixel-switching TFT, a poly-Si TFT having an electric field-effect mobility of 100 $cm^2$/V-s or more is used as the driving element, and formation of these poly-Si TFTs and the transparent pixel electrode is conducted on the transparent substrate.

The significance of this constitution is as follows. An element having an electric field-effect mobility of 1–25 $cm^2$/V-s makes it possible to switch the pixel at a sufficient speed. The electric field-effect mobility within this range can be obtained by a production process wherein a polysilicon layer is made at the stage of depositing silicon particles on a substrate. Thus, even if a display portion is made large, switching can be realized without dispersion.

On the contrary, the electric field-effect mobility of 100 $cm^2$/V-s and more can be realized in a Si type TFT formed on a substrate. The electric field-effect mobility of 100 $cm^2$/V-s or more makes necessary and sufficient high-speed control possible. Thus, the above-mentioned constitution makes it possible to provide inexpensively an array substrate for a liquid crystal display device wherein moving images can be displayed with high minuteness.

A twenty second embodiment concerned in the fifth invention group is characterized in that in the twenty first embodiment, a poly-Si TFT having an electric field-effect mobility of 1–25 $cm^2$/V-s is used as the pixel-switching TFT, a MOS transistor having an electric field-effect mobility of 100 $cm^2$/V-s or more is used as the driving element, and the MOS transistor is afterward mounted on the transparent substrate.

A poly-Si TFT having an electric field-effect mobility of 1–25 $cm^2$/V-s is sufficient to turn on and turn off transmission of light. If a MOS transistor having an electric field-effect mobility of 100 $cm^2$/V-s or more is afterwards mounted as the driving element on this poly-Si TFT, it is possible to make a TFT array substrate for a liquid crystal display device, the substrate in which the performance of the MOS transistor can be sufficiently utilized and high-frequency driving is possible.

(6) Sixth Invention Group

A twenty third concerned in the sixth invention group is a TFT array substrate for an in-plane type liquid crystal display element, comprising at least a first tandem type pixel electrode, a pixel-switching TFT for switching the first tandem pixel electrode, a driving element for driving the pixel-switching TFT, and a second tandem type pixel electrode opposite to the first tandem type pixel electrode, arranged on a substrate, characterized in that a poly-Si TFT having an electric field-effect mobility of 1–25 $cm^2$/V-s is used as the pixel-switching TFT, a poly-Si TFT having an electric field-effect mobility of 100 $cm^2$/V-s or more is used as the driving element, and formation of these poly-Si TFTs and the first and second tandem type pixel electrodes is conducted on the substrate.

According to this constitution, it is possible to make a TFT array for a liquid crystal display device which can be driven with high frequency. Moreover, in this substrate, angle dependence about display is little.

A twenty fourth embodiment concerned in the sixth invention group is characterized in that in the twenty third embodiment, a poly-Si TFT having an electric field-effect mobility of 1–25 $cm^2$/V-s is used as the pixel-switching TFT, a MOS transistor having an electric field-effect mobility of 100 $cm^2$/V-s or more is used as the driving element, and the MOS transistor is afterward mounted on the transparent substrate.

A combination of the poly-Si TFT having an electric field-effect mobility of 1–25 $cm^2$/V-s and the afterward-mounted MOS transistor having an electric field-effect mobility of 100 $cm^2$/V-s or more makes it possible to provide inexpensively an IPS mode TFT array for a liquid crystal display device which can be driven with high frequency and has a wide field angle.

(7) Seventh Invention Group

A twenty fifth of the present invention is characterized in that in the embodiment of the 21st, 22nd, 23rd or 24th, the pixel-switching poly-Si TFT is an n channel type and the electric field-effect mobility thereof is 5–25 $cm^2$V-s.

The n channel type TFT has a high electric field-effect mobility. Furthermore, if a poly-Si TFT whose electric field-effect mobility is set to 5–25 $cm^2$/V-s is used as the pixel-switching element, it is possible to make a TFT array for a liquid crystal display device having sufficient high-speed responsibility.

Of course, in the present invention, another element or other elements may be further added to each of the above-mentioned embodiments. For example, an opposite electrode (a common electrode) formed on a second substrate is made of a reflection film composed mainly of metal Al and further a color filter is formed on the surface of the opposite electrode, so that a reflection type color liquid crystal display device can be made. On the contrary, the color filter is first made on the second substrate and the opposite electrode of a transparent conductive film is formed thereon, so that a transmission type color liquid crystal display device can be made.

BEST MODES FOR CARRYING OUT THE INVENTION

Examples of the present invention will be described mainly on the basis of processes for forming a polysilicon layer on a substrate. The greatest feature of the present invention is that a polysilicon layer is formed at the stage when silicon particles excited and ionized by application of energy are used to deposit the silicon particles on a substrate. According to this method, it is unnecessary to raise the temperature of the substrate when the polysilicon layer is formed. In the following respective examples, therefore, inexpensive glass substrates whose heat-resistance is 600° C. or lower are used. However, the present invention does not exclude the use of quartz substrates resisting temperatures over 600° C. instead of such glass substrates.

EXAMPLE 1

Figure 1:
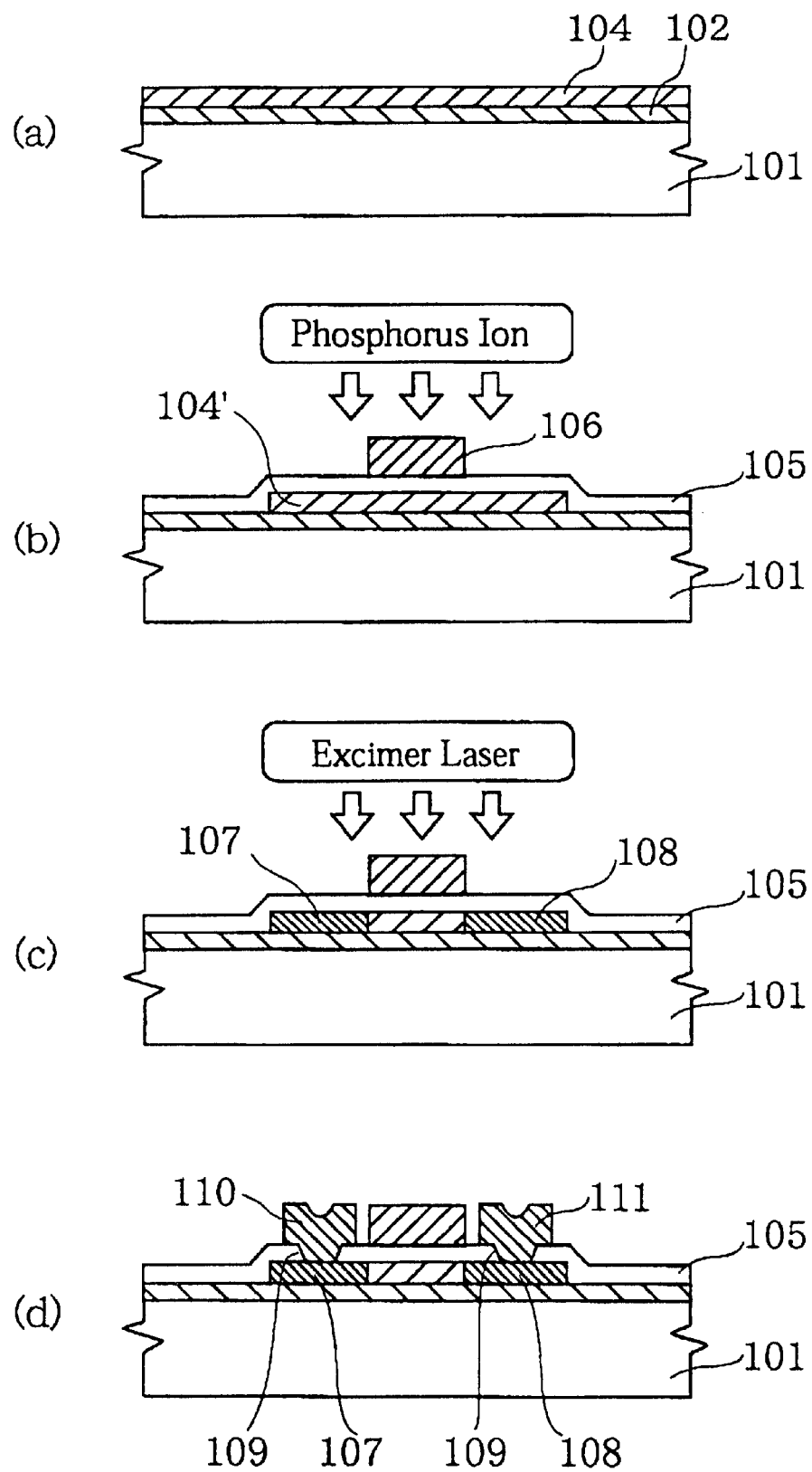
FIG. 1 is a portional view showing a production process of a poly-Si TFT according to the present invention.

The production process of a thin film transistor in Example 1 of the present invention will be described on the basis of FIG. 1. FIG. 1 is a portional view schematically showing a substrate-portion in each step. In FIG. 1, 101 represents a glass substrate; 102, a buffer layer; 104, a polysilicon layer; 105, a gate insulator layer; 106, a gate electrode; 107, a source electrode; 108, a drain area; 109, contact holes; 110, a source electrode; and 111, a drain electrode.

The production process is as follows. A $SiO_2$ layer, for example, 5000 Å in thickness is formed as the buffer layer 102 on the glass substrate 101. A pressure gradient type plasma gun described later is used to form the polysilicon layer 104 on this buffer layer 102 (FIG. 1(a)). Details of the method for forming the polysilicon layer 104 will be described later.

Next, a photolithographic process is used to etch the polysilicon layer 104 so as to form a pattern having a given shape. Thereafter, The gate insulator layer 105 composed of $SiO_2$, for example, 1500 Å in thickness is formed on the patterned polysilicon layer 104'. Furthermore, the gate electrode 106 composed of Mo, for example, 6000 Å in thickness is formed on this gate insulator layer 105. For example, phosphorus ions are implanted into the polysilicon layer 104, using this gate electrode 106 as a mask (FIG. 1(b)).

Thereafter, by irradiation with an excimer laser beam, the phosphorus ions implanted into the polysilicon layer 104 are activated to form the source area 107 and the drain area 108 (FIG. 1(c)).

The gate insulator layer 105 is further etched to make the contact holes 109/109 reaching the source area 107 and the drain area 108, respectively. Al 3000 Å in thickness is embedded in the contact holes 109 to form the source electrode 110 and the drain electrode 111.

In the above explanation, the production process of only one TFT (thin film transistor) was described. However, in the poly-Si TFT array substrate, many TFTs produced in the same way as above are formed. In the poly-Si TFT array substrate according to Example 1, poly-Si TFTs are formed as a peripheral driving circuit, as well as in the pixel portion. A gate bus line and a source bus line for connecting these driving TFTs and pixel-switching TFTs are further formed. A pixel electrode composed of, for example, indium tin oxide is also formed on the drain electrode 111.

Figure 4:
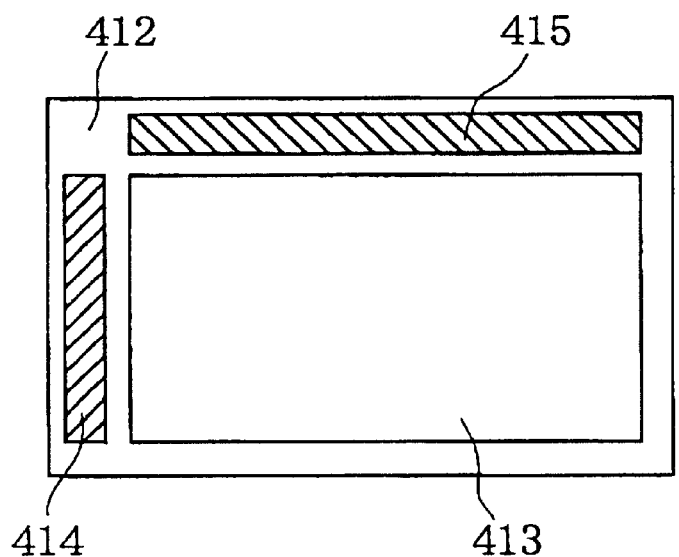
FIG. 4 is a plan view showing an outline of a TFT array substrate.
Figure 4:
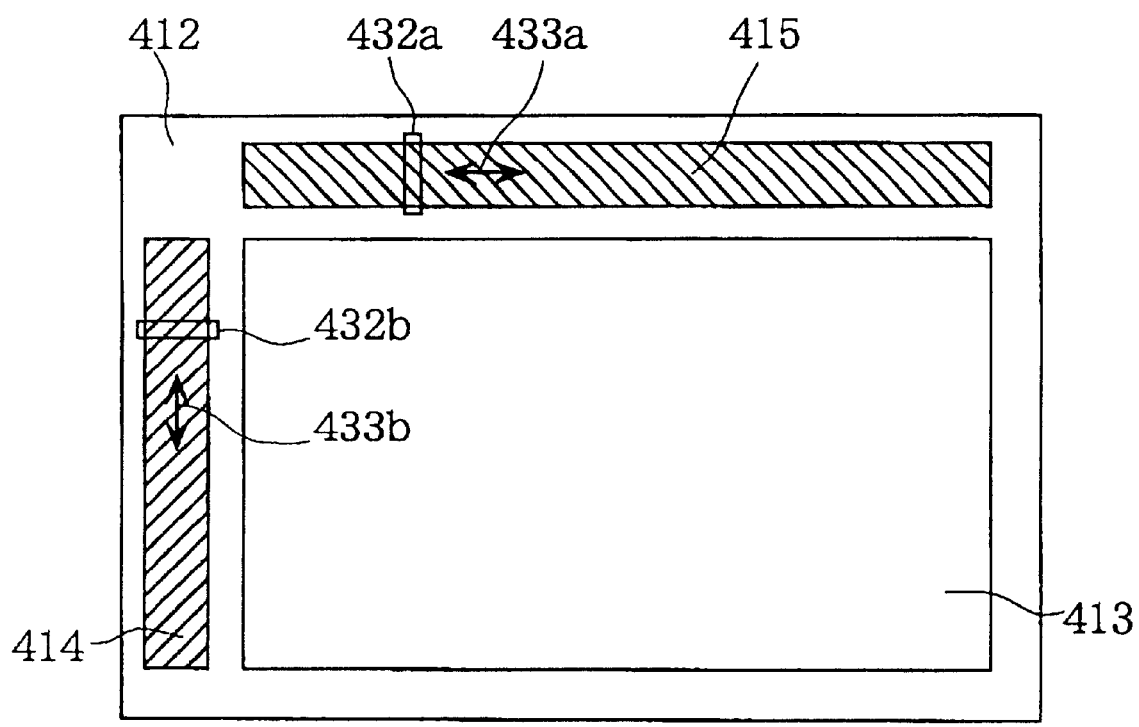

The following will describe the outline of such a poly-Si TFT array substrate according to Example 1 on the basis of FIG. 4.

As shown in FIG. 4(a), a pixel portion 413 and driving circuit portions composed of a gate driving circuit portion 414, a source driving circuit portion 415, and the like are disposed on a single glass substrate 412. In the pixel portion 413, a lot of non-illustrated pixels are made in a matrix form and pixel-switching TFTs for switching these pixels are made, the number of which corresponds to the respective pixels. Gate driving TFTs and source driving TFTs for driving the pixel-switching TFTs are further made in the gate driving circuit portion 414 and the source driving circuit portion 415.

The following will specifically describe the method for forming a polysilicon layer, using a pressure gradient plasma gun.

Figure 2:
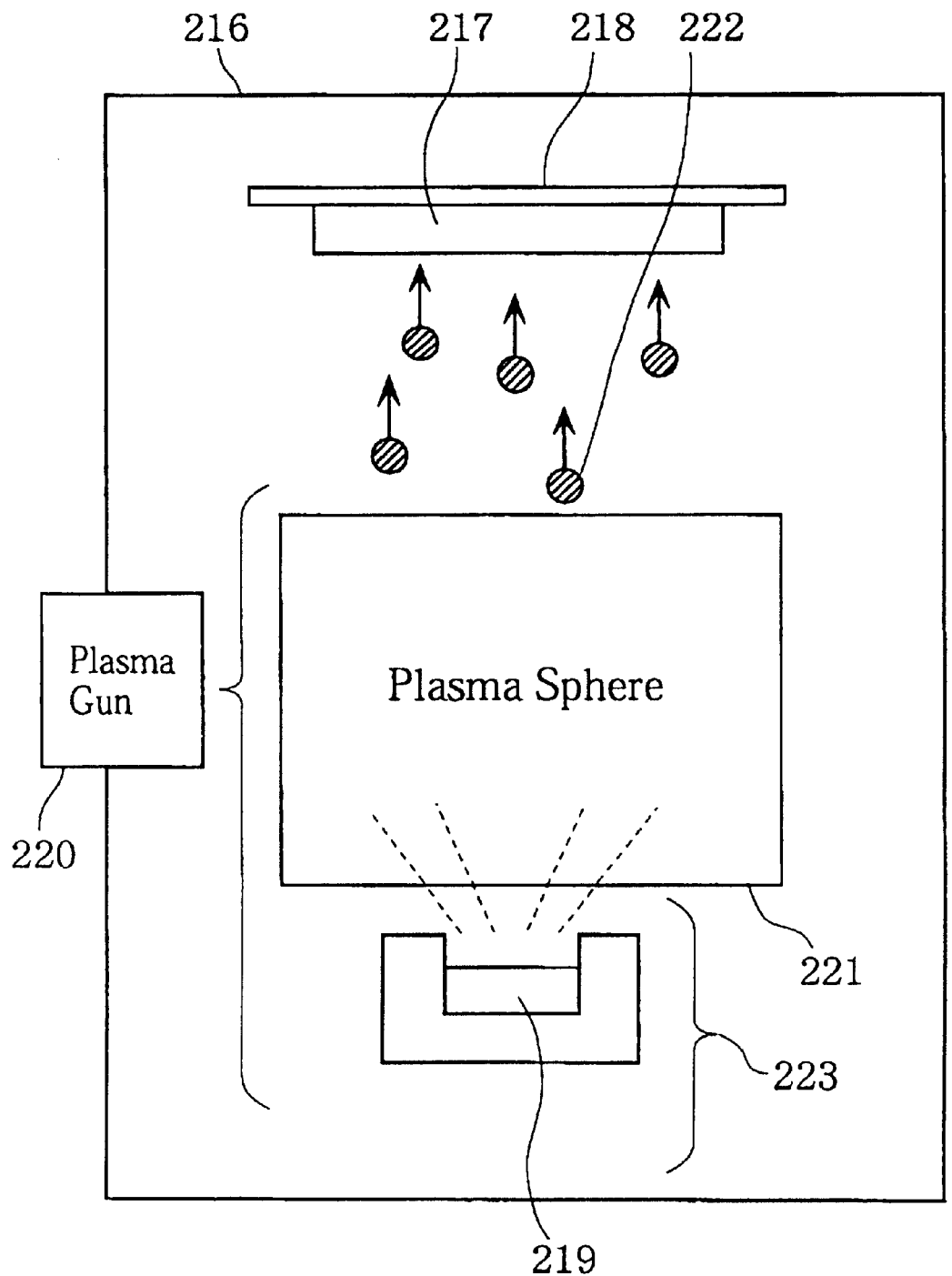
FIG. 2 is a conception view for explaining a structure of a apparatus using a pressure gradient type plasma gun.

In Example 1, the polysilicon layer is formed using a apparatus shown in FIG. 2 into which a pressure gradient type plasma gun made by Sumitomo Heavy Industries, Ltd. is integrated. This device is a device which comes under the category of an ion plating method, and is newly developed. FIG. 2 is a conception view for explaining a apparatus.

In FIG. 2, 212 represents a vacuum chamber, which is the body of the device; 217, a glass substrate on which polysilicon should be deposited; 218, a holder on which the glass substrate 217 is put; and 219, an evaportion source for forming a polysilicon layer. In this example, a polysilicon tablet is used. 222 represents excited and ionized silicon particles.

220 represents a pressure gradient type plasma gun as an excited and ionized particle generating means constituting the main portion of this device. This pressure gradient type plasma gun 220 has an vaporized particle generating portion 223 and a plasma atmosphere region 221. In the device of Example 1, the vaporized particle generating portion 223 applies thermal energy of direct current arc discharge to the vapor source 219 to vaporize silicon particles. In the plasma atmosphere region 221, Ar gas is excited so that plasma atmosphere having a high density is produced. This device has a structure wherein silicon particles generated in the vaporized particle generating portion 223 are introduced into the plasma atmosphere region 221 to be excited and ionized and subsequently the glass substrate 217 put on the holder 218 is bombarded with the particles. When the glass substrate 217 is bombarded with the ionized silicon particles, the silicon particles are deposited on the substrate and further polycrystallization advances at the same time of the deposition step.

About specific conditions of the formation of the polysilicon layer, there was used a borate silica glass substrate undercoated with $SiO_2$ (a buffer layer) of 5000 Å, as the glass substrate 217. The vacuum degree of the vacuum chamber 216 was set to $3 \times 10^{-4}$ Torr, and the discharge current from the pressure gradient type plasma gun 220 was set to about 100 A. While the glass substrate 217 put on the holder 218 under this condition was heated to 200° C., the excited and ionized silicon particles 222 were deposited onto the glass substrate 217 for 20 seconds.

As a result thereof, a polysilicon layer of about 1000 Å was formed on the glass substrate 217. This polysilicon layer was then subjected to the steps of FIGS. 1(b)–(d), to produce an n channel type poly-Si TFT array substrate.

The transistor characteristics of the poly-Si TFT produced as above were measured. As a result, the electric field-effect mobility thereof was 5 cm$^2$/V-s. This value is about 10 times larger than the electric field-effect mobility of amorphous silicon and has a performance enabling sufficient practical use as a switching element for an active matrix mode liquid crystal display device.

Incidentally, if a apparatus using a pressure gradient type plasma gun is used, advantageous as follows are produced: a polysilicon layer which is superior in electric field-effect mobility can be obtained. The following will describe reasons thereof.

(1) Silicon particles excited and ionized with the pressure gradient type plasma gun has a high energy. Thus, most of them reach the glass substrate in the state that they are ionized. Thereafter, they have the energy so that they migrate, in the deposited layer, to stable points where their energy state is more stabilized. For this reason, the deposited layer is crystallized at the stage when the silicon particles is deposited on the substrate. Besides, when microscopic defects are generated in the crystal during the step of the advance of the crystallization, the silicon particles migrate to remove the defects, thereby forming a product wherein crystal grains having few crystal defects gather. A polysilicon layer superior in minuteness is also formed by the migration. The polysilicon layer composed of the crystal grains which are superior in minuteness and have few crystal defects is superior in electric field-effect mobility. The inventors have verified that a polysilicon thin film composed of crystal grains 500–700 nm in size can be formed by the production method of Example 1 and if this polysilicon thin film is used to produce an n channel TFT, an electric field-effect mobility of 5 to 25 cm$^2$/V-s can be realized.

(2) The production method of the present invention, wherein solid silicon (a silicon tablet) is used to generate vaporized particles, makes it possible to make the area where they are vaporized large. If this vaporized area is made large, excited and ionized silicon particles can be deposited onto a glass substrate from various directions. Thus, the production method of the present invention makes it possible to form a polysilicon layer superior in uniformity.

(3) According to the production method of the present invention using a apparatus in which a pressure gradient type plasma gun is used, a polysilicon layer is formed at the same time when silicon particles are deposited on a substrate. Thus, it is unnecessary to form a silicon layer (an amorphous layer) once and subsequently conduct recrystallization as in the prior art. Productivity is superior accordingly. The method of depositing vaporized silicon particles makes it possible to form a uniform polysilicon layer. Thus, a liquid crystal display device which has a large screen and is high in exactitude can be realized at a low price.

(4) In the device shown in FIG. 2, the glass substrate 217 is arranged outside the plasma atmosphere region 221. In such a device, plasma particles (Ar particles) do not collide with the glass substrate 217. Thus, a rise in the temperature of the substrate is not caused by collision with the plasma particles. That is, if the apparatus of FIG. 2 is used, a polysilicon layer can be formed in the state that the temperature of the substrate is kept low. Therefore, an inexpensive glass substrate can be used. The inventors have verified that even at a substrate temperature of 100° C. or lower, a polysilicon layer can be formed.

EXAMPLE 2

In Example 1, the peripheral driving circuit was also made from a poly-Si TFT, but in Example 2 a poly-Si TFT array substrate for a liquid crystal display device was produced by a method of mounting an IC chip on which a peripheral driving circuit was formed afterwards on a substrate, instead of the peripheral driving circuit composed of the poly-Si TFT. Elements other than the peripheral driving circuit were as the same in Example 1. The word "mounting afterward" in the specification means integration of an element which is separately produced into a substrate.

The electric field-effect mobility of the pixel-switching poly-Si TFT formed in Example 2 was 5 cm$^2$/V-s. This mobility is about 10 times that of amorphous type TFTs. The IC chip used in this Example is a chip in which MOS transistors are formed on a monocrystal silicon layer, and has a highly faster driving speed than the above-mentioned pixel-switching poly-Si TFT. Thus, the substrate of Example 2, in which the poly-Si TFT having a sufficient performance as a pixel-switching element and the IC chip were combined, made it possible to obtain a far minuter image than amorphous type TFT array substrates.

EXAMPLE 3

Figure 5:
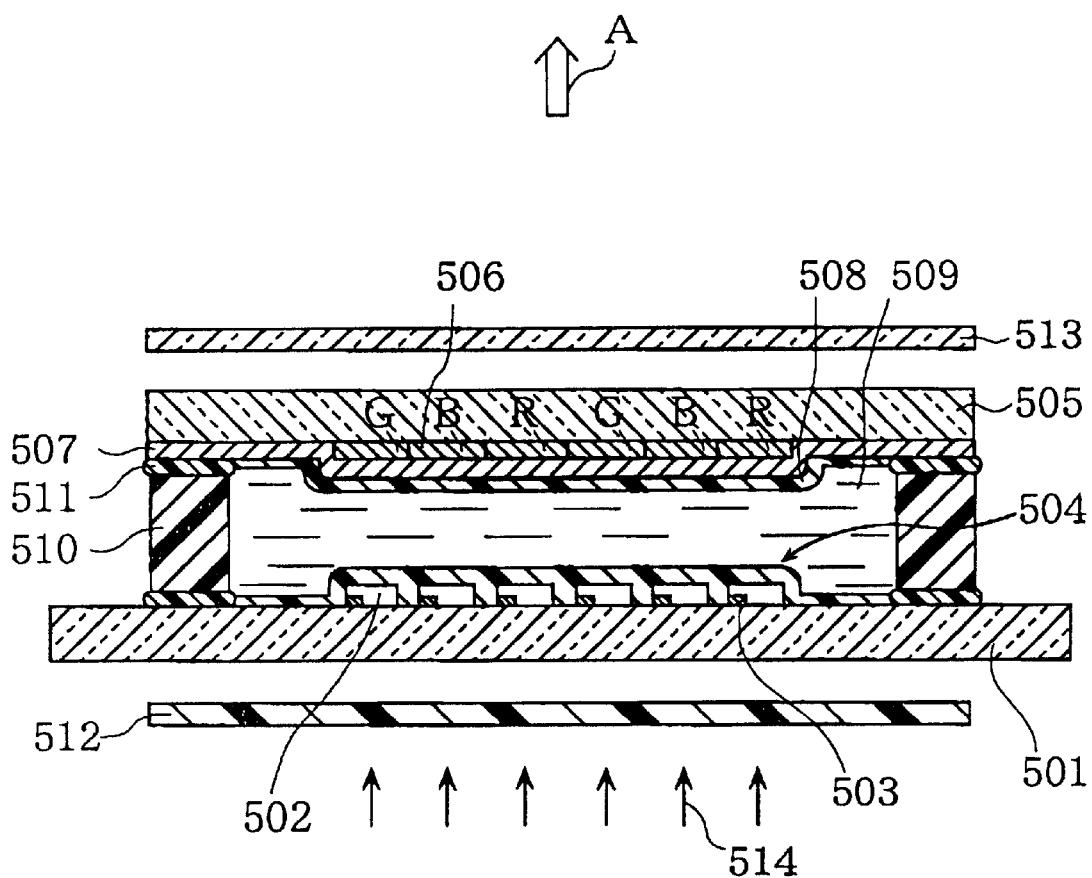
FIG. 5 is a portional view showing an outline of a liquid crystal display device according to the present invention.

In Example 3, the poly-Si TFT array substrate produced in Example 1 was used to produce a liquid crystal display device shown in FIG. 5.

FIG. 5 is a schematic portional view of the liquid crystal display device concerned in Example 3. In FIG. 5, 501 represents a first substrate produced by using the poly-Si TFT array substrate produced in Example 1. The first substrate 501 is provided with a matrix-form pixel electrode group 502 produced by the method described in Example 1 and a TFT group 503 for driving these pixel electrodes. A liquid crystal oriented film 504 is further formed on the pixel electrode group 502.

In the meanwhile, 505 represents a second substrate opposite to the first substrate 501. In this second substrate 505, a color filter group 506 in G(green), B (blue) and R (red), an opposite electrode (common electrode) 607, and a liquid crystal oriented film 508 are made on a transparent glass substrate which is separately prepared.

The first substrate and the second substrate are put together to have a gap about 5 μm in thickness therebetween in such a manner that the orientation directions of their liquid crystals twist at 90 degrees. Their liquid crystal oriented films are opposite to each other, and a spacer 610 and an adhesive 511 lie between the two substrates. A twist nematic liquid crystal (ZLI 4792 made by Merk) 509 are put and confined in the gap. Furthermore, polarizing plates 512 and 513 are arranged outside the two substrates.

In the liquid crystal display device of Example 3 having such a structure, moving images are displayed using video signals, so that clearer and minuter images can be obtained than liquid crystal display devices using amorphous silicon in the prior art. In FIG. 5, an arrow 514 and an arrow A represent a direction of radiation from a back light and a direction for the display of the images, respectively.

EXAMPLE 4

An IPS (in-plane switching) type poly-Si TFT array substrate was produced in the same manner as in Example 1 except that the pixel electrodes in Example 1 were replaced by a couple of tandem type pixel electrodes (see FIG. 6) composed of a first tandem type electrode and a second tandem type electrode. Furthermore, a known liquid crystal oriented film was formed on the surface of this substrate. This substrate was used as a first substrate.

On the other hand, the same liquid crystal oriented film as above was formed on a transparent glass substrate, which was separately prepared. This was used as a second substrate.

The first substrate and the second substrate were put together to have any gap therebetween in the state that their liquid crystal oriented films faced inwards. A nematic liquid crystal was put and confined in the gap to produce an IPS type liquid crystal display device.

This liquid crystal display device was driven using video signals. As a result, it was verified that a minute and clear image was obtained.

EXAMPLE 5

Figure 3:
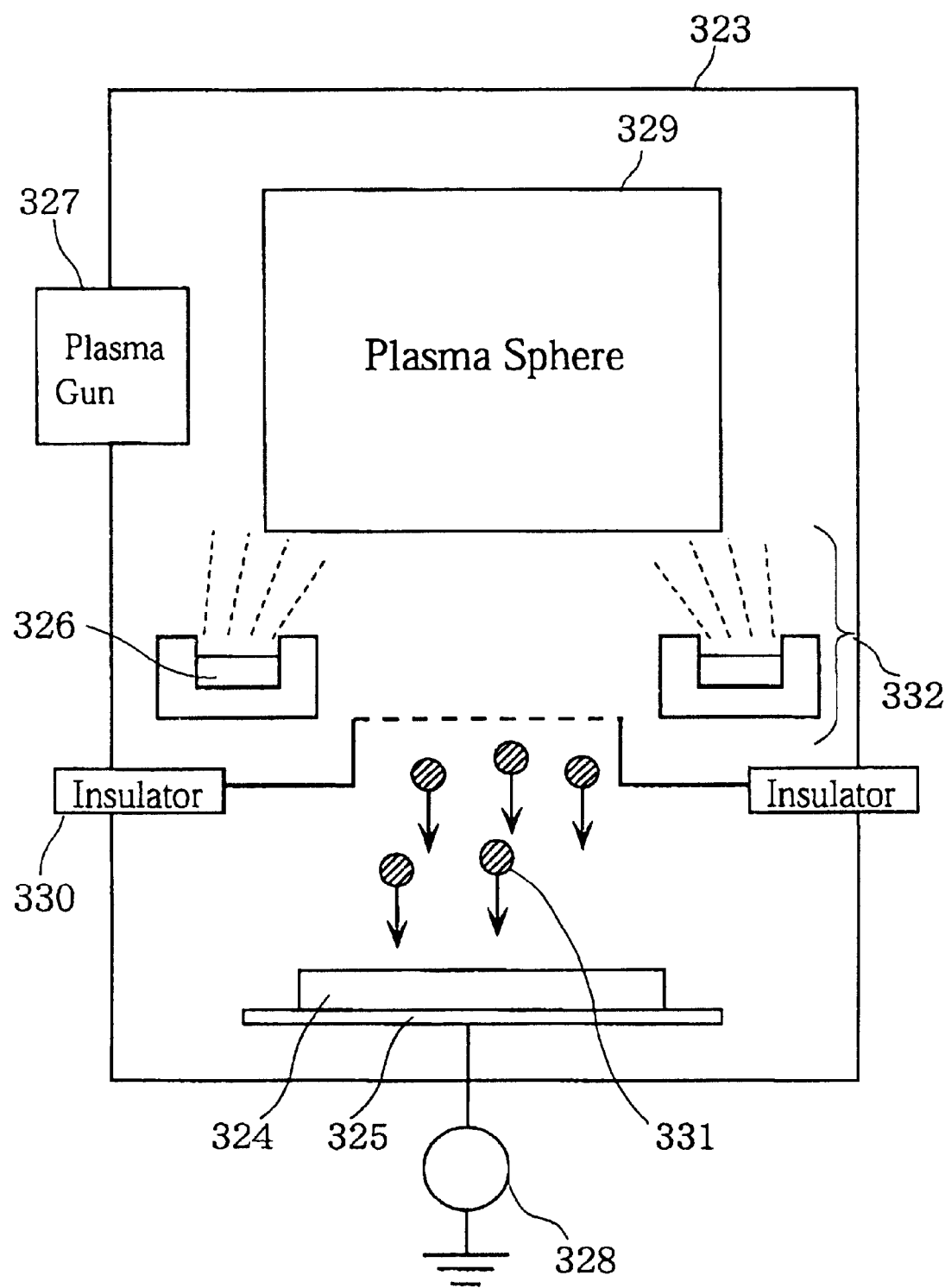
FIG. 3 is a conception view for explaining a structure of another apparatus using a pressure gradient type plasma gun.

A TFT array substrate for a liquid crystal display device was produced in the same manner as in Example 1 except that a apparatus shown in FIG. 3 was used instead of the device of FIG. 2.

The device shown in FIG. 3 is a device using a pressure gradient type plasma gun (made by Sumitomo Heavy Industries, Ltd.) in the same way as shown in FIG. 2. In FIG. 3, 323 represents a vacuum chamber; 324, a glass substrate on which a polysilicon layer should be deposited; 325, a holder on which the glass substrate 324 is put; 328, a voltage applying means; and 330, an insulator for separating the glass substrate 324 and a plasma atmosphere region 329 electrically. 326 represents a siliconvaporation source which is a raw material of the polysilicon layer. (A silicon table is used herein.) 331 represents excited and ionized silicon particles.

327 represents a pressure gradient type plasma gun used for evaporating the vapor source 326 and exciting the silicon particles by plasma. This pressure gradient type plasma gun 327 has an vaporized particle generating portion 332 and a plasma atmosphere region 229. In the device of FIG. 5, an vaporized particle generating portion 332 applies thermal energy of direct current arc discharge to the vapor source 326 to vaporize the silicon particles. In the plasma atmosphere region 329, Ar gas is excited to produce high density plasma atmosphere.

In the device of FIG. 3, the vaporized particle generating portion 332 is arranged in the middle of the plasma atmosphere region 329 and the substrate 324. That is, the glass substrate 324 is arranged at a side (lower side) different from the side (plasma atmosphere region side) where the silicon particles are vaporized. Therefore, in the device having this structure, the silicon particles generated in the vaporized particle generating portion 332 are first vaporized in the direction opposite to the substrate 324 and introduced into the plasma atmosphere region 329. Herein, the particles are excited and ionized, and then deposited onto the substrate 324 by action of an electric field applied by the voltage applying means 328.

In other words, this structure makes it possible to selectively deposit only the ionized silicon particles out of the excited particles in the plasma atmosphere region 329 on the glass substrate 324. Accordingly, this case makes it possible to form a better polysilicon layer than the case in which the device of FIG. 2, from which neutral particles and the like are also deposited. This is because the ionized particles have a high energy level to migrate sufficiently in the deposited layer.

It has been verified that if the array substrate produced in this Example is used to produce a liquid crystal display device (including an IPS type liquid crystal display device), minuter display can be realized.

EXAMPLE 6

A poly-Si TFT array substrate was produced in the same manner as in Example 1 except that the following step was added: the step of forming a polysilicon layer on a substrate and subsequently heat-treating only a specific area of this polysilicon layer selectively to be recrystallized.

More specifically, a polysilicon layer was first formed on a transparent glass substrate. Thereafter, a polysilicon area where a peripheral driving circuit portion was to be formed was subjected to irradiation with an excimer laser beam (annealing treatment). Only the area was recrystallized. About the applying conditions of the excimer laser beam of the recrystallization, the excimer laser beam of 350 mJ/cm² was applied. The matters except the selective heat-treatment (the specific area heating step) were the same as in Example 1. Explanation thereof is herein omitted.

By the above-mentioned method, a TFT array substrate was produced wherein the electric field-effect mobility of the area not subjected to the heating treatment (the pixel area) was 5 cm²/V-s and that of the area subjected to the heat treatment (the driving circuit portion) was 250 cm²/V-s.

Next, a gate insulating film was formed on the polysilicon layer produced in the above-mentioned step. A p or n type impurity was diffused to form source/drain areas. Thereafter, a metal thin film was vapor-deposited thereon, to form gate electrodes and a gate bus line. An interlayer insulation film was further formed and then a metal thin film was again vapor-deposited thereon, to form source electrodes and a source bus line. In this way, a pixel-switching TFT group and a driving TFT group for driving the pixel-switching TFTs were formed on the substrate. Moreover, a transparent pixel electrode group was formed to make a TFT array substrate for a liquid crystal display device.

Furthermore, a known liquid crystal oriented film was formed on the surface of the pixel electrode group of this TFT array substrate for a liquid crystal display device. This was used as a first substrate. On the other hand, an opposite electrode was formed on a transparent glass substrate which was separately prepared. A liquid crystal oriented film was formed thereon. This was used as a second substrate.

The first substrate and the second substrate were put together in the manner that their liquid crystal oriented films faced inward and the substrates had a given gap therebetween. By a method of putting and confining a liquid crystal in the gap, a liquid crystal display device of Example 3 was completed.

Using video signals, moving images were displayed on this liquid crystal display device so that minute and clear images were obtained.

The peripheral driving circuit portion means a circuit for controlling and driving the pixel-switching TFTs. Specifically, this circuit indicates the gate driving circuit portion 414, the source driving circuit portion 415 shown in FIG. 4(a), and the like. For the heating treatment to the specific area of the peripheral driving circuit portion, it is advisable that an excimer laser beam of 300–450 mJ/cm² is generally used. The inventors have verified that by irradiation with an excimer laser beam within this scope, the electric field-effect mobility of the peripheral driving circuit portion can be raised to 100–500 cm²/V-s.

EXAMPLE 7

Figure 6:
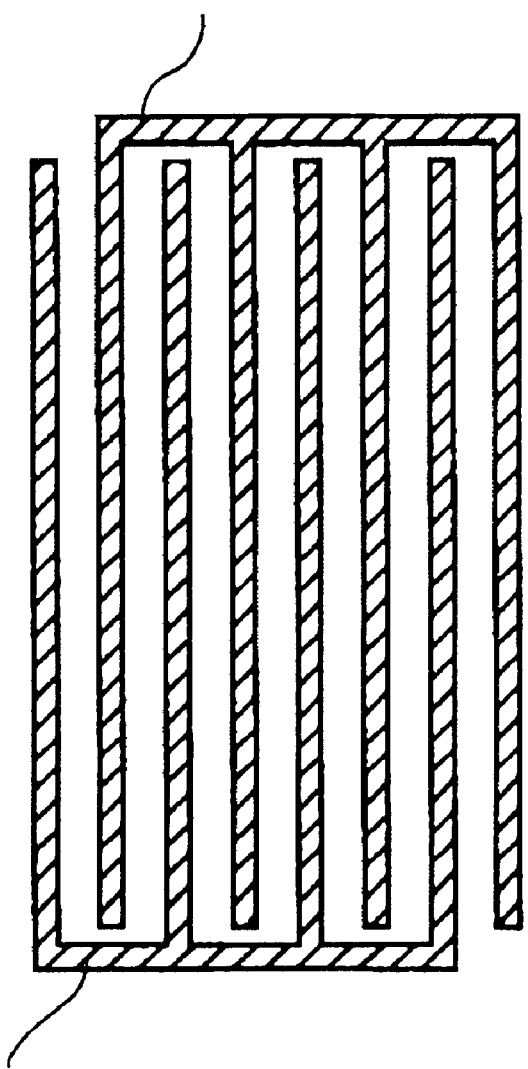
FIG. 6 is a portional view showing an outline of a tandem type pixel electrode.
Figure 7:
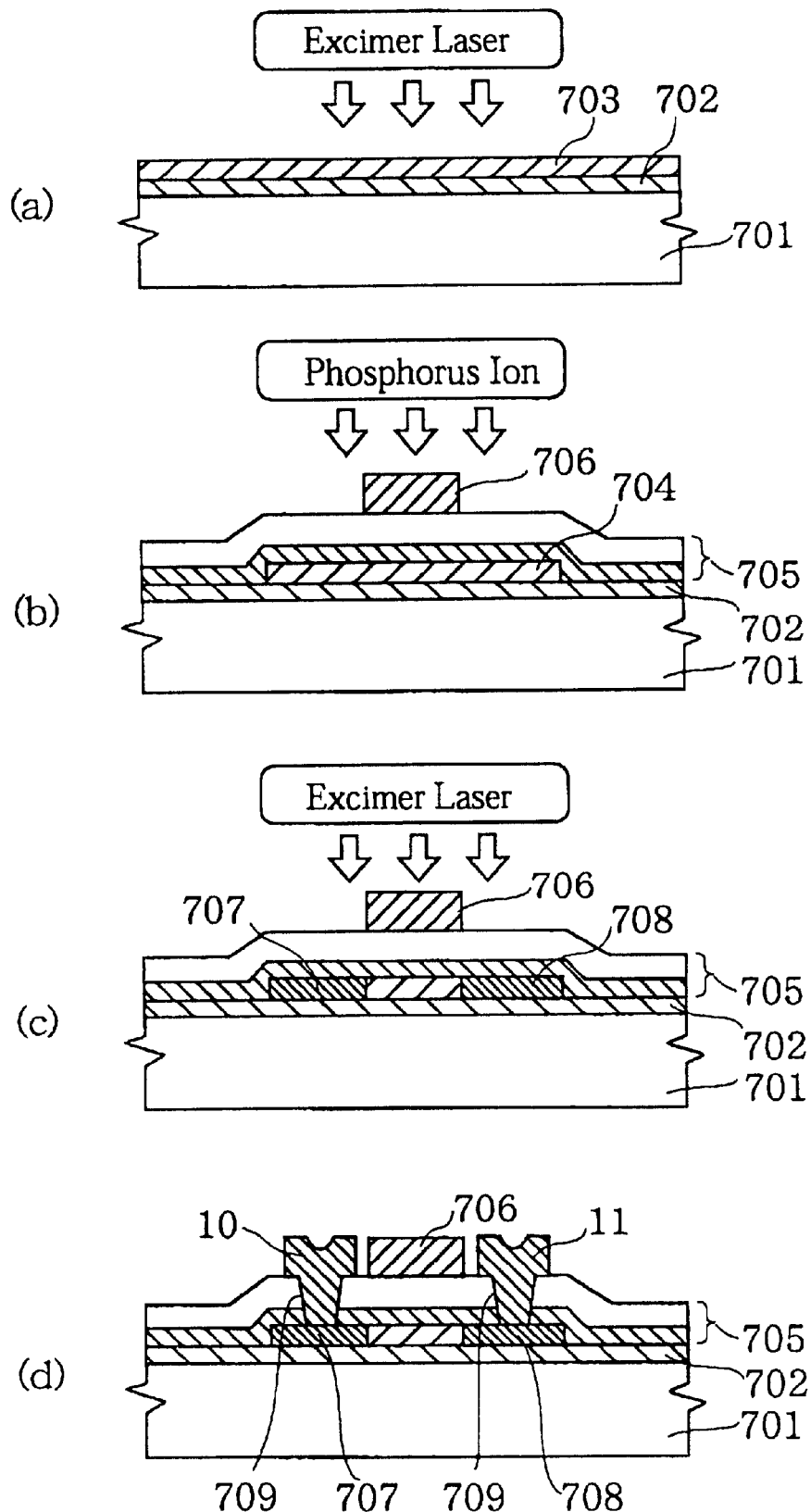
FIG. 7 is a portional view showing a production process of a low temperature processed poly-Si TFT in the prior art.

An IPS (in-plane switching) type liquid crystal display device, wherein liquid crystal molecules were rotated by a lateral electric field along an in-plane direction, was produced in the same manner as in Example 6 except that the transparent pixel electrodes on the first substrate in Example 6 was replaced by a pair of the first and second tandem type pixel electrodes shown in FIG. 6 and no opposite electrode was formed on the second substrate opposite to the first substrate. About the tandem type pixel electrodes, pixel-switching TFTs and a driving circuit were formed and subsequently the first tandem type pixel electrode and the second tandem type pixel electrode were separately formed. Thereafter, a liquid crystal oriented film was formed.

About this liquid crystal display device, moving images were displayed using video signals so that minute and clear images were obtained.

EXAMPLE 8

Example 8 has a feature that not only a polysilicon layer but also a gate insulator layer were produced with a apparatus using a pressure gradient type plasma gun. Other matters were the same as in Example 1. In other words, the method for producing a thin film transistor of Example 8 is the same as in Example 1, the steps of FIGS. 1(*a*), (*c*) and (*d*). Only the step of FIG. 1(*b*) was different.

In the step of FIG. 1(*b*), a apparatus having the same structure as shown in FIG. 2 was used when the gate insulator layer 105 was formed. As the vapor source 219, solid $Si_3N_4$ or $SiO_2$, which was the same as the raw material of the gate insulator layer 105, was arranged. Other conditions were made identical to the thin film forming conditions in Example 1, so as to form a silicon oxide film on a substrate.

Significance of the method of using the apparatus to form the gate insulator layer as described above is as follows.

First, the very same as the constituent material of the gate insulator layer is used as the vapor source and this material is excited to be deposited on the polysilicon layer. Therefore, the amount of impurities in the formed gate insulator layer can be made very small. For example, in the case of the $SiO_2$ film, Nss (surface state density) can be made to $10^{12}/cm^2$ or less. Thus, according to this Example, dehydrogenation for removing impurities becomes unnecessary.

Incidentally, for the formation of $SiO_2$ as a gate insulator layer, silane-based gas or TEOS (tetraethoxysilane)-based gas has been hitherto used. However, $SiO_2$ produced using the silane-based gas has a OH group and TEOS-based materials contain carbon. These impurities are factors which produce a bad effect on the performance of TFTs, and are originally unnecessary.

If the above-mentioned apparatus is used, $Si_3N_4$ or $SiO_2$ can be efficiently vaporized over a large area in the same way as in the case of forming the polysilicon layer. Therefore, a uniform and fine gate insulator layer can be formed.

Furthermore, by adopting a load lock system, the gate insulator layer can be continuously formed on the polysilicon layer, which is an active layer of the TFT, without the polysilicon layer being exposed to the atmosphere. Thus, it is possible to prevent the interface between the polysilicon layer and the gate insulator layer from being polluted. As a result, variation of Vt characteristics of the respective TFTs can be remarkably reduced.

The above-mentioned description is about an example wherein the device of FIG. 2 was used. Of course, however, the device of FIG. 3 can be used.

INDUSTRIAL APPLICABILITY

As described above, according to the present invention, wherein polysilicon is formed at the stage of depositing silicon particles on a substrate, a polysilicon layer having an electric field-effect mobility about 2–50 times larger than that of amorphous silicon can be formed even if laser annealing is not conducted. Moreover, the polysilicon layer formed by this method has high in-plane uniformity. Thus, the high uniformity can be kept even if this layer is made large. Accordingly, a poly-Si TFT array substrate for a liquid crystal display device using such a polysilicon layer, according to the present invention, makes highly minute display possible and its in-plane electric field-effect mobility is uniform. For this reason, even if a large screen is made, a good-quality image having little display unevenness can be obtained. Thus, the present invention is a very useful technique for making the screen of a liquid crystal display device large and highly minute, and the industrial significance of the present invention is great.

What is claimed is:

1. A method for producing a TFT array substrate for a liquid crystal display device comprising a production process of forming a poly-Si TFT having a channel area in a polysilicon semiconductor layer located on a substrate, the production process comprising:

forming a polysilicon layer by using an apparatus comprising a vaporized particle-generating portion for generating vaporized silicon particles, a plasma atmosphere region for exciting the vaporized silicon particles generated in the vaporized particle-generating portion, a substrate-holding portion disposed outside the plasma atmosphere region and opposed to the plasma atmosphere region so that the vaporized particle-generating portion is between the plasma atmosphere region and the substrate-holding portion, and a voltage applying means for applying an electric field between the plasma atmosphere region and the substrate-holding portion so that, using the electric field, silicon particles excited and ionized in the plasma atmosphere region are extracted and applied onto a surface of the substrate, locating a substrate on the substrate holding portion, and subsequently depositing silicon particles excited in the plasma atmosphere region onto a substrate so that the polysilicon layer is formed at the stage when the silicon particles are deposited on the substrate surface.

2. A method for producing a TFT array substrate for a liquid crystal display device according to claim 1, wherein the plasma atmosphere region comprises Ar plasma produced by exciting argon gas.

3. A method for producing a TFT array substrate for a liquid crystal display device according to claim 2, further comprising providing an insulator between the plasma atmosphere region and the substrate holding portion, the insulator for electrically separating the plasma atmosphere region and the substrate holding portion.

4. A method for producing a TFT array substrate for a liquid crystal display device according to claim 2, further comprising applying thermal energy to a vapor source comprising a solid silicon and generating vaporized silicon particles in the vaporized particle generating portion.

5. A method for producing a TFT array substrate for a liquid crystal display device according to claim 4, wherein the thermal energy is arc discharge energy.

6. A method for producing a TFT array substrate for a liquid crystal display device according to claim 2, further comprising generating vaporized silicon particles in the vaporized particle generating portion by decomposing a gaseous silicon compound with high frequency energy.

7. A method for producing a TFT array substrate for a liquid crystal display device according to claim 2, further comprising, after forming the polysilicon layer, heat-treating the formed polysilicon layer increase crystallinity.

8. A method for producing a TFT array substrate for a liquid crystal display device according to claim 7, wherein the heat-treating is conducted in atmosphere containing hydrogen.

9. A method for producing a TFT array substrate for a liquid crystal display device according to claim 2, further comprising, after forming the polysilicon layer, forming a pixel-switching poly-Si TFT for switching a pixel and forming a poly-Si TFT for driving the pixel-switching poly-Si TFT.

10. A method for producing a TFT array substrate for a liquid crystal display device according to claim 9, further comprising, prior to forming the poly-Si type TFT for driving, selectively heat-treating only a specific area where the poly-Si TFT for driving is to be formed to increase the crystallinity of the polysilicon layer in the specific area.

11. A method for producing a TFT array substrate for a liquid crystal display device according to claim 10, wherein heat-treating the specific area is conducted in atmosphere containing hydrogen.

12. A method for producing a TFT array substrate for a liquid crystal display device according to claim 10, wherein an excimer laser is used as a heating means for heat-treating the specific area.

13. A method for producing a TFT array substrate for a liquid crystal display device according to claim 10, wherein an infrared ray lamp is used as a heating means for heat-treating the specific area.

14. A method for producing a TFT array substrate for a liquid crystal display device according to claim 11, wherein the heat-treating is conducted so that the electric field-effect mobility of the specific area is 100 cm$^2$/V-s or more.

15. A method for producing a TFT array substrate for a liquid crystal display device according to claim 7, further comprising, after the heat-treating, forming a pixel-switching poly-Si TFT for switching a pixel and integrating an IC chip into the substrate, a monocrystal silicon IC chip having therein a circuit for driving the produced pixel-switching poly-Si TFT.

16. A method for producing a TFT array substrate for a liquid crystal display device in which a gate insulator layer is formed on a silicon semiconductor layer, comprising:
using an apparatus for forming a thin film comprising a vaporized particle generating portion for generating vaporized silicon particles by applying thermal energy to a vapor source that is in the form of solid, a plasma atmosphere region for exciting vaporized silicon particles generated in the vaporized particle generating portion, a substrate holding portion disposed outside the plasma atmosphere region and opposite the plasma atmosphere region through the vaporized particle generating portion as a middle position; and
disposing material for a gate insulator layer in the vapor source, placing a substrate having a silicon semiconductor layer formed thereon on the substrate holding portion, and applying excited particles onto the silicon semiconductor layer to form a gate insulator layer, the exited particles being excited in the plasma atmosphere region.

17. A method for producing a TFT array substrate for a liquid crystal display device in which a gate insulator layer is formed on a silicon semiconductor layer, comprising:
generating, in a particle generating portion, particles containing atoms that constitute the gate insulator layer by, using high frequency energy, decomposing a gaseous compound containing said atoms,
generating excited particles by introducing the particles into a plasma atmosphere region and applying energy thereto, the plasma atmosphere region produced by exciting argon gas, and
providing a thin film forming apparatus, the thin film forming apparatus comprising a substrate holding portion disposed outside the plasma atmosphere region and opposite to the plasma atmosphere region so that the particle generating portion is between the plasma atmosphere region and the substrate holding portion, and a voltage applying means for applying an electric field between the plasma atmosphere region and the substrate holding portion so that, using the electric field, silicon particles excited and ionized in the plasma atmosphere region are extracted and applied onto a surface of the substrate,
locating a substrate on the substrate-holding portion, and guiding the excited particles onto the substrate to deposit the excited particles thereon, to form a gate insulator layer on the silicon semiconductor layer.

18. A method for producing a TFT array substrate for a liquid crystal display device in which a gate insulator layer is formed on a silicon semiconductor layer, comprising:
forming a polysilicon layer on a substrate by applying thermal energy to a vapor source comprising solid silicon to vaporize the silicon to prepare silicon particles, exciting and ionizing the silicon particles in a plasma atmosphere region, and depositing the silicon particles onto the substrate; and
forming a gate insulator layer by exciting argon gas to produce a high density plasma and applying thermal energy resulting therefrom to vaporize a solid vapor source comprising a substance that constitutes the gate insulator layer to produce particles,
exciting and ionizing the particles in the plasma atmosphere region, and
depositing the particles on the substrate to form a layer.

19. A method for producing a TFT array substrate for a liquid crystal display device according to claim 18, further comprising providing a thin film forming apparatus for forming the polysilicon layer and the gate insulator layer, the apparatus comprising a vaporized particle generating portion for generating vaporized particles by applying thermal energy to a vapor source that is in the form of a solid, a plasma atmosphere region for exciting vaporized particles generated in the vaporized particle generating portion by applying energy to the vaporized particles to produce excited particles, a substrate holding portion disposed outside the plasma atmosphere region and opposite the plasma atmosphere region so that the vaporized particle generating portion is between the plasma atmosphere region and the substrate holding portion, and a voltage applying means for applying an electric field between the plasma atmosphere region and the substrate-holding portion so that, using the electric field, particles excited and ionized in the plasma atmosphere region are extracted and applied onto a surface of the substrate.

20. A method for producing a TFT array substrate for a liquid crystal display device, comprising providing on a single transparent substrate at least one transparent pixel electrode, a pixel-switching TFT for switching the transparent pixel electrode and a driving element for driving the pixel-switching TFT; wherein
the driving element is a poly-Si TFT comprising a polysilicon layer having an electric field-effect mobility of 100 cm$^2$/V-s or more; and the polysilicon layers in the pixel-switching TFT and the driving element are formed using a thin film forming apparatus, the apparatus comprising a portion for generating vaporized particles by applying thermal energy to a solid vapor source, a plasma atmosphere region for exciting the vaporized particles generated in the vaporized particle generating portion by applying energy to the vaporized particles to prepare excited particles, a substrate holding portion disposed outside the plasma atmosphere region and opposite the plasma atmosphere region so that the vaporized particle-generating portion is between the plasma atmosphere region and the substrate-holding portion, and a voltage applying means for applying an electric field between the plasma atmosphere region and the substrate-holding portion so that, using the electric field, particles excited and ionized in the plasma atmosphere region are extracted and applied onto a surface of the substrate.

21. A TFT array substrate for a liquid crystal display element according to claim 20, wherein the pixel-switching poly-Si TFT is an n channel type, and the electric field-effect mobility is 5–25 $cm^2/V$-s.

22. A method for producing a TFT array substrate for a liquid crystal display device, comprising providing a transparent substrate having thereon at least a transparent pixel electrode, a pixel-switching TFT for switching the transparent pixel electrode, and a driving element for driving the pixel-switching TFT, wherein:

the pixel-switching TFT is a poly-Si TFT comprising a polysilicon layer having an electric field-effect mobility of 1C25 $cm^2/V$-s;

the driving element is a MOS transistor comprising a polysilicon layer having an electric field-effect mobility of 100 $cm^2/V$-s or more and is mounted on the transparent substrate;

and the polysilicon layer of the pixel-switching TFT is formed using a thin film forming apparatus, the apparatus comprising a vaporized particle generating portion for generating vaporized particles by applying thermal energy to a solid vapor source, a plasma atmosphere region for exciting the vaporized particles generated in the vaporized particle generating portion by applying energy to the vaporized particles to prepare excited particles, a substrate holding portion disposed outside the plasma atmosphere region and opposite the plasma atmosphere region so that the vaporized particle-generating portion is between the plasma atmosphere region and the substrate-holding portion, and a voltage applying means for applying an electric field between the plasma atmosphere region and the substrate-holding portion so that, using the electric field, silicon particles excited and ionized in the plasma atmosphere region are extracted and applied onto a surface of the substrate.

23. A method for producing a TFT array substrate for an in-plane type liquid crystal display element, comprising, providing on a single substrate, at least a first comb-shaped pixel electrode, a pixel-switching TFT for switching the first comb-shaped pixel electrode, a driving element for driving the pixel-switching TFT, and a second comb-shaped pixel electrode disposed opposite the first comb-shaped pixel electrode, wherein the pixel-switching TFT is a poly-Si TFT comprising a polysilicon layer having an electric field-effect mobility of 1C25 $cm^2/V$-s;

the driving element is a poly-Si TFT comprising a polysilicon layer having an electric field-effect mobility of 100 $cm^2/V$-s or more; and the polysilicon layers in the pixel-switching TFT and the driving element are formed by using a thin film forming apparatus, the apparatus comprising a vaporized particle generating portion for generating vaporized particles by applying thermal energy to a solid vapor source, a plasma atmosphere region for exciting the vaporized particles generated in the vaporized particle generating portion by applying energy to the vaporized particles to prepare excited particles, a substrate holding portion disposed outside the plasma atmosphere region and opposite to the plasma atmosphere region so that the vaporized particle-generating portion is between the plasma atmosphere region and the substrate-holding portion, and a voltage applying means for applying an electric field between the plasma atmosphere region and the substrate-holding portion so that, using the electric field, silicon particles excited and ionized in the plasma atmosphere region are extracted and applied onto a surface of the substrate.

24. A method for producing a TFT array substrate for an in-plane type liquid crystal display element, comprising providing on a single substrate, at least a first comb-shaped pixel electrode, a pixel-switching TFT for switching the first comb-shaped pixel electrode, a driving element for driving the pixel-switching TFT, and a second comb-shaped pixel electrode disposed opposite the first comb-shaped pixel electrode, wherein the pixel-switching TFT is a poly-Si TFT comprising a polysilicon layer having an electric field-effect mobility of 1C25 $cm^2/V$-s;

the driving element is a MOS transistor comprising a polysilicon layer having an electric field-effect mobility of 100 $cm^2/V$-s or more and is mounted on the transparent substrate; and the pixel-switching TFT is formed using a thin film forming apparatus, the apparatus comprising a vaporized particle generating portion for generating vaporized particles by applying thermal energy to a solid vapor source, a plasma atmosphere region for exciting the vaporized particles generated in the vaporized particle generating portion by applying energy to the vaporized particles to prepare excited particles, a substrate holding portion disposed outside the plasma atmosphere region and opposite the plasma atmosphere region so that the vaporized particle-generating portion is between the plasma atmosphere region and the substrate-holding portion, and a voltage applying means for applying an electric field between the plasma atmosphere region and the substrate-holding portion so that, using the electric field, silicon particles excited and ionized in the plasma atmosphere region are extracted and applied onto a surface of the substrate.

25. A polysilicon thin film forming method for forming a polysilicon thin film on a substrate, comprising:

forming a polysilicon layer by using an apparatus for forming a thin film, the apparatus comprising a vaporized particle generating portion for generating vaporized silicon particles, a plasma atmosphere region for exciting the vaporized silicon particle generated in the vaporized particle generating portion to produce excited silicon particles, a substrate holding portion disposed outside the plasma atmosphere region and opposite to the plasma atmosphere region so that the vaporized particle-generating portion is between the plasma atmosphere region and the substrate-holding portion, and a voltage applying means for applying an electric field between the plasma atmosphere region and the substrate-holding portion so that, using the electric field, silicon particles excited and ionized in the plasma atmosphere region are extracted and applied onto a surface of the substrate; and putting the substrate on the substance holding portion, and subsequently depositing the excited silicon particles on the substrate so that the polysilicon layer is formed on the substrate at the age when the silicon particles are deposited on the substrate.

26. A polysilicon thin film forming method according to claim 25, wherein the plasma atmosphere region is composed of Ar plasma produced by exciting argon gas.

27. A polysilicon thin film forming method according to claim 26, wherein a means for applying an electric field is provided between the plasma atmosphere region and the substrate holding portion, whereby the silicon particles excited and ionized in the plasma atmosphere region are guided to a surface of the substrate by the electric field.

28. A polysilicon thin film forming method according to claim 27, wherein an insulator for electrically separating the plasma atmosphere region and the substrate holding portion is provided therebetween.

29. A polysilicon thin film forming method according to claim 27, further comprising, after the polysilicon layer forming step, a heat-treating step of heating the polysilicon layer formed in the polysilicon layer forming step, to increase crystallinity thereof.

30. A polysilicon thin film forming method according to claim 29, where the heat-treating in the heat-treating step is conducted in atmosphere containing hydrogen.

31. A polysilicon thin film forming method according to claim 26, further comprising, after the polysilicon layer forming step, a phosphorus doping step of doping phosphorus in the polysilicon layer.

* * * * *